(12) United States Patent
Tsai et al.

(10) Patent No.: US 8,952,744 B1
(45) Date of Patent: Feb. 10, 2015

(54) SEMICONDUCTOR DEVICE AND OPERATING METHOD FOR THE SAME

(71) Applicant: Macronix International Co., Ltd., Hsinchu (TW)

(72) Inventors: Ying-Chieh Tsai, Chiayi (TW); Wing-Chor Chan, Hsinchu (TW); Jeng Gong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/955,038

(22) Filed: Jul. 31, 2013

(51) Int. Cl.
*H03K 17/72* (2006.01)
*H01L 29/739* (2006.01)
*H03K 17/567* (2006.01)

(52) U.S. Cl.
CPC .......... *H01L 29/7393* (2013.01); *H03K 17/567* (2013.01)
USPC ............ 327/438; 327/439; 327/441; 257/124

(58) Field of Classification Search
USPC ................. 257/476, 477, 478, 489, 484, 355, 257/E27.015; 327/65–508
See application file for complete search history.

(56) References Cited

U.S. PATENT DOCUMENTS

| | | | |
|---|---|---|---|
| 2002/0066906 A1* | 6/2002 | Werner .......................... | 257/124 |
| 2011/0121428 A1* | 5/2011 | Lin et al. ........................ | 257/592 |
| 2011/0127583 A1* | 6/2011 | Uhlig et al. .................... | 257/252 |
| 2013/0113036 A1* | 5/2013 | Roger et al. ................... | 257/328 |
| 2014/0001528 A1* | 1/2014 | Pfirsch et al. ................. | 257/300 |
| 2014/0159110 A1* | 6/2014 | Tsai et al. ...................... | 257/141 |
| 2014/0175528 A1* | 6/2014 | Zieren et al. .................. | 257/295 |

* cited by examiner

*Primary Examiner* — Brandon S Cole
(74) *Attorney, Agent, or Firm* — McClure, Qualey & Rodack, LLP

(57) ABSTRACT

A semiconductor device and an operating method for the same are provided. The semiconductor device includes a first doped region, a second doped region, a first doped contact, a second doped contact, a first doped layer, a third doped contact and a first gate structure. The first doped contact and the second doped contact are on the first doped region. The first doped contact and the second doped contact has a first PN junction therebetween. The first doped layer is under the first or second doped contact. The first doped layer and the first or second doped contact has a second PN junction therebetween. The second PN junction is adjoined with the first PN junction.

20 Claims, 5 Drawing Sheets

SEMICONDUCTOR DEVICE AND OPERATING METHOD FOR THE SAME

BACKGROUND

1. Technical Field

The disclosure relates to a semiconductor device and an operating method for the same, and more particularly to an IGBT device and an operating method for the same.

2. Description of the Related Art

In the semiconductor technology, the feature size of the semiconductor structure has been reduced. In the meantime, the rate, the efficiency, the density and the cost per integrated circuit unit have been improved.

Shrinking the device area would drop the electrical efficiency of the semiconductor structure dramatically. For maintain the electrical efficiency of the semiconductor structure, during operating the device, it is desired that the high operating voltage and leakage of the HV device would not affect the LV device to reduce the operating efficiency of the semiconductor device.

SUMMARY

A semiconductor device is provided. The semiconductor device comprises a first doped region, a second doped region, a first doped contact, a second doped contact, a first doped layer, a third doped contact and a first gate structure. The first doped region has a first conductivity. The second doped region is adjoined with the first doped region, and has a second conductivity opposite to the first conductivity. The first doped contact and the second doped contact are on the first doped region. The first doped contact and the second doped contact has a first PN junction therebetween. The first doped layer is under the first or second doped contact. The first doped layer and the first or second doped contact has a second PN junction therebetween. The second PN junction is adjoined with the first PN junction. The third doped contact has the first conductivity, and is in the second doped region. The first gate structure is on the second doped region between the first doped region and the third doped contact.

An operating method for a semiconductor device is provided. The semiconductor device comprises a first doped region, a second doped region, a first doped contact, a second doped contact, a first doped layer, a third doped contact and a first gate structure. The first doped region has a first conductivity. The second doped region is adjoined with the first doped region, and has a second conductivity opposite to the first conductivity. The first doped contact and the second doped contact are on the first doped region. The first doped contact and the second doped contact has a first PN junction therebetween. The first doped layer is under the first or second doped contact. The first doped layer and the first or second doped contact has a second PN junction therebetween. The second PN junction is adjoined with the first PN junction. The third doped contact has the first conductivity, and is in the second doped region. The first gate structure is on the second doped region between the first doped region and the third doped contact. The operating method comprises following steps. A first voltage is applied to the first gate structure. The first doped contact and the second doped contact is electrically connected to a first electrode being one of an anode electrode and a cathode electrode. The third doped contact is electrically connected to a second electrode being the other of the anode electrode and the cathode electrode.

The above and other aspects of the disclosure will become better understood with regard to the following detailed description of the non-limiting embodiment(s). The following description is made with reference to the accompanying drawings.

DETAILED DESCRIPTION

Figure 1:
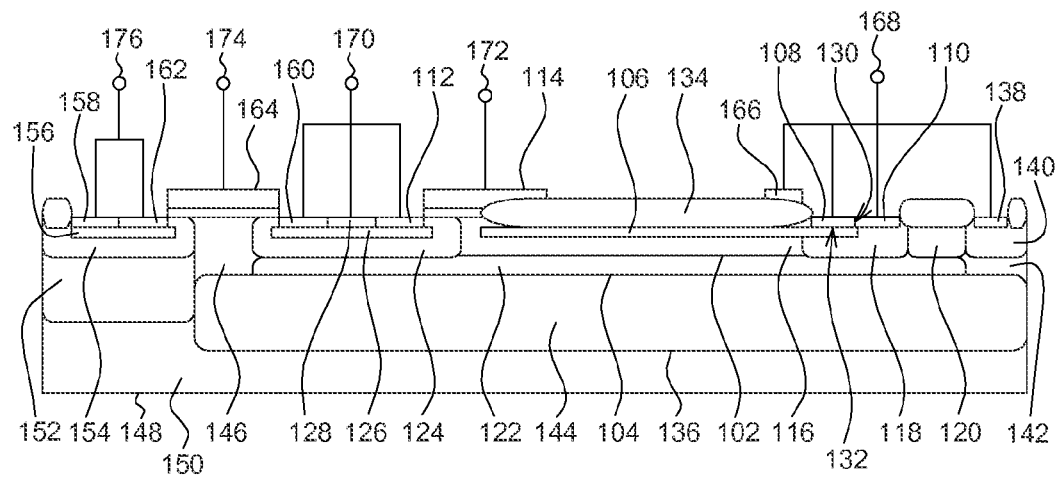
FIG. 1 illustrates a cross-section of a semiconductor device according to one embodiment.

FIG. 1 illustrates a cross-section of a semiconductor device according to one embodiment. The semiconductor device comprises a first doped region 102, a second doped region 104, a first doped layer 106, a first doped contact 108, a second doped contact 110, a third doped contact 112 and a first gate structure 114.

The first doped region 102 may comprise a doped well 116 and a doped well 118 adjoined to each other. In one embodiment, the doped well 116 and the doped well 118 have a first conductivity such as N-type conductivity. For example, the doped well 116 is a HVNW.

The second doped region 104 may comprise a doped well 120, a buried doped layer 122, a doped well 124, a second doped layer 126 and a contact region 128 adjoined with each other, and all of witch have a second conductivity, such as P-type conductivity, opposite to the first conductivity. For example, the doped well 120 and the doped well 124 are HVPD. The contact region 128 is heavily doped (P+). In one embodiment, the doped well 116 and the doped well 118 of the first doped region 102 are surrounded by the doped well 120, the buried doped layer 122, the doped well 124, the second doped layer 126 and the contact region 128 of the second doped region 104.

The first doped contact 108 and the second doped contact 110 are on the doped well 118 of the first doped region 102. The first doped contact 108 and the second doped contact 110 having opposing conductivities have a first PN junction 130 therebetween. In one embodiment, the first doped contact 108 and the second doped contact 110 form a shorted anode.

The first doped layer 106 is under the first doped contact 108, and on the doped well 116 and the doped well 118 of the first doped region 102. The first doped layer 106 and the first doped contact 108 have a second PN junction 132 therebetween. The second PN junction 132 and the first PN junction 130 adjoined with each other have L shape. In one embodiment, the first doped layer 106 has the second conductivity such as P-type conductivity.

In this embodiment, the first doped contact 108 has the first conductivity such as N-type conductivity. The second doped contact 110 has the second conductivity such as P-type conductivity. In one embodiment, the first doped contact 108 and the second doped contact 110 are heavily doped (P+) contact regions.

The third doped contact 112 is among the doped well 124, the second doped layer 126 and the contact region 128 of the second doped region 104. In one embodiment, the third doped contact 112 has the first conductivity such as N-type conductivity. For example, the third doped contact 112 is a heavily doped (N+) contact region.

The first gate structure 114 is on the doped well 124 between the doped well 116 and the third doped contact 112. An isolation layer 134 may be disposed on the first doped layer 106 and the doped well 116 of the first doped region 102. The isolation layer 134 is not limited to FOX as shown in FIG. 1, and may comprise other suitable insulating structures, such as STI, etc.

The semiconductor device may comprise a third doped region 136 that may comprise a contact region 138, a doped well 140, a doped well 142, a buried doped layer 144 and a doped well 146 adjoined with each other, and all of them have the first conductivity such as N-type conductivity. For example, the contact region 138 is heavily doped (N+). The doped well 146 is HVNW. In one embodiment, the second doped region 104 is surrounded by the contact region 138, the doped well 140, the doped well 142, the buried doped layer 144 and the doped well 146 of the third doped region 136, as shown in FIG. 1.

The semiconductor device may comprise a fourth doped region 148 that may comprise a substrate 150, a buried doped layer 152, a doped well 154, a third doped layer 156 and a contact region 158 adjoined with each other, and all of them have the second conductivity such as P-type conductivity. For example, the doped well 154 is HVPD. The contact region 158 is heavily doped (P+).

A contact region 160 is disposed among the doped well 124, the second doped layer 126 and the contact region 128 of the second doped region 104. In one embodiment, the contact region 160 has the first conductivity such as N-type conductivity. For example, the contact region 160 is heavily doped (N+).

A contact region 162 is disposed among the doped well 154, the third doped layer 156 and the contact region 158 of the fourth doped region 148. In one embodiment, the contact region 162 has the first conductivity such as N-type conductivity. For example, the contact region 162 is heavily doped (N+).

A second gate structure 164 is on the doped well 124, the doped well 146 and the doped well 154 between the contact region 160 and the contact region 162. A conductive layer 166 may be on the isolation layer 134. The conductive layer 166 may comprise polysilicon, or other suitable materials.

In embodiments, the first doped contact 108, the second doped contact 110, the conductive layer 166 and the contact region 138 of the third doped region 136 may be electrically connected with an electrode 168. The third doped contact 112, the contact region 160 and the contact region 128 of the second doped region 104 may be electrically connected with an electrode 170. The first gate structure 114 may be electrically connected with an electrode 172. The second gate structure 164 may be electrically connected with an electrode 174. The contact region 162 and the contact region 158 of the fourth doped region 148 may be electrically connected with an electrode 176.

In embodiments, the semiconductor device is functioned as an IGBT device. The first gate structure 114 is functioned as a gate for the IGBT device. For example, during operating the device, the electrode 168 is an anode electrode that may apply 0V~700V. The electrode 170 is a cathode electrode that may apply 0V or be grounded. The electrode 172 may apply a voltage of 0V-15V. The electrode 174 may apply a voltage of 0V~15V. The electrode 172 and the electrode 174 may be a common electrode. The electrode 176 is a substrate electrode that may apply 0V, or be grounded.

During operating the IGBT device by high voltage, an inversion layer is generated by lifting voltage from the 168 (anode electrode). Hole current induced from the inversion layer is injected from the electrode 168, and therefore a electron current in the device is amplified. An NPN bipolar structure formed by the first doped contact 108, the second doped contact 110, the first doped layer 106 and the doped well 118 of the first doped region 102 can help increasing the hole current and thus further increasing an amplifying ratio of the electron current for the device. This NPN bipolar structure can prevent the IGVT device from undesired voltage snapback or negative differential resistance (NDR) effects. The (P-type conductivity) first doped layer 106 extended under the isolation layer 134 and adjacent to the first gate structure 114 can provide a flow channel closer to the electrode 170 for the hole current, and therefore the hole current can be prevented from going into the substrate 150 and affecting other devices such as LV devices.

The second gate structure 164 may be functioned as a DMOS gate for controlling forming channels in doped well 146 adjacent to the contact region 162 and in the doped well 124 adjacent to the contact region 160. In embodiments, the IGBT device may provide an addition current path by the second gate structure 164 for forming the channel connected to the contact region 162, the contact region 160, the doped well 146, the buried doped layer 144, the doped well 142, the doped well 140, the contact region 138. In other words, the IGBT can have multi channels, and thus the anode current of the IGBT device can be increased.

The (P-type conductivity) buried doped layer 122 and the doped well 120 adjacent to the electrode 168 (anode electrode) also can restrict the hole current to avoid going into the substrate 150 and affecting other devices. A PN junction between the doped well 146, the buried doped layer 144, the doped well 142, the doped well 140, and the contact region 138 of the first conductivity such as N-type conductivity, and the doped well 124, the buried doped layer 122, and the doped well 120 of the second conductivity such as P-type conductivity can further restrict the hole current induced from the inversion layer during operating the IGBT device by high voltage in the buried doped layer 122 and the doped well 120, and therefore, the hole current can be prevented from going into the substrate 150 to affect other devices.

In embodiments, the IGBT device has low turn on voltage and low turn on resistance (Rdson-sp).

The second doped layer 126 among the contact region 128, the third doped contact 112, the contact region 160 and the doped well 124, and the third doped layer 156 among the contact region 158, the contact region 162 and the doped well 154 can prevent the device from punch through effect during operation.

Figure 2:
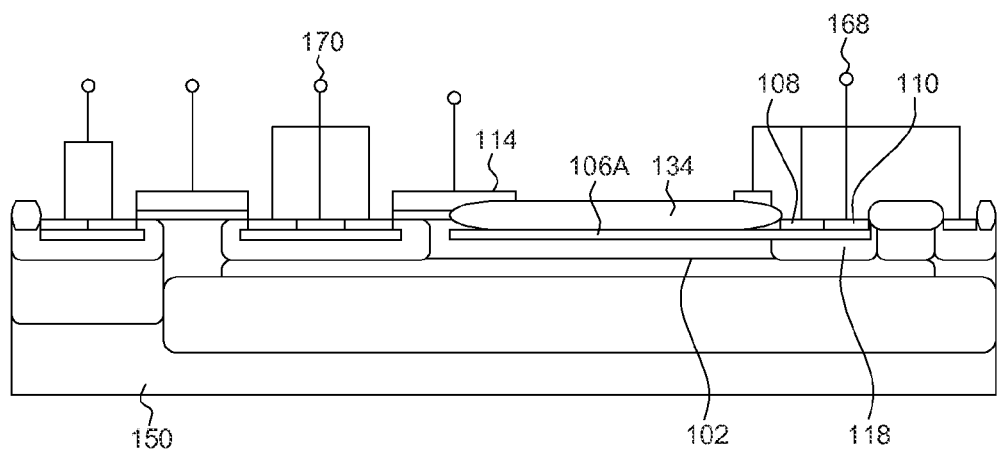
FIG. 2 illustrates a cross-section of a semiconductor device according to one embodiment.

FIG. 2, which illustrates a cross-section of a semiconductor device according to one embodiment, is different from FIG. 1 in following description. Referring to FIG. 2, the first doped layer 106A is adjoined with and under the first doped contact 108 and the second doped contact 110. In one embodiment, the second doped contact 110 has the first conductivity such as N-type conductivity, and the first doped contact 108 and the first doped layer 106A have the second conductivity such as P-type conductivity. In another embodiment, the first doped contact 108 has the first conductivity such as N-type conductivity, and the second doped contact 110 and the first doped layer 106A have the second conductivity such as P-type conductivity. During operating the IGBT device, an NPN bipolar structure formed by the first doped contact 108, the second doped contact 110, the first doped layer 106A and the doped well 118 of the first doped region 102 can help increasing the hole current and thus increasing an amplifying ratio of the electron current for the device. This NPN bipolar structure can prevent the IGVT device from undesired voltage snapback or negative differential resistance (NDR) effects. The (P-type conductivity) first doped layer 106 extended under the isolation layer 134 and adjacent to the first gate structure 114 can provide a flow channel closer to the electrode 170 for the hole current, and therefore the hole current can be prevented from going into the substrate 150 and affecting other devices.

Figure 3:
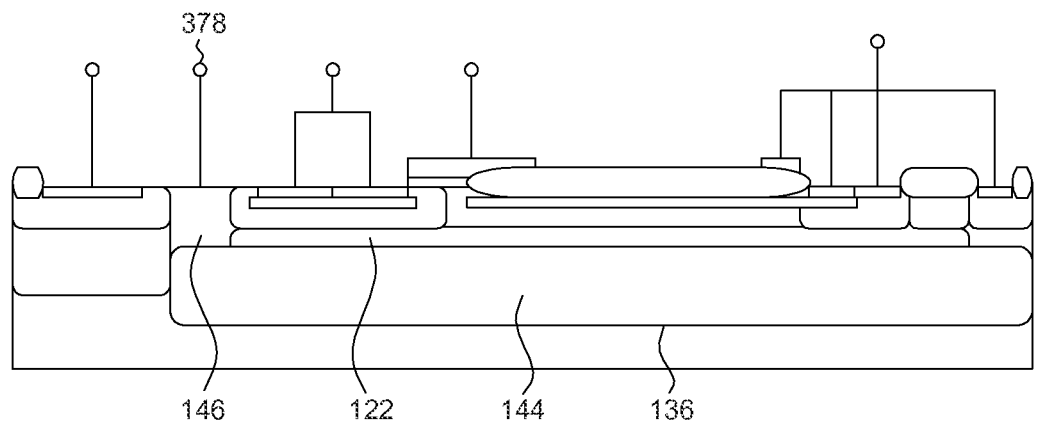
FIG. 3 illustrates a cross-section of a semiconductor device according to one embodiment.

FIG. 3, which illustrates a cross-section of a semiconductor device according to one embodiment, is different from FIG. 1 in following description. In the semiconductor device as shown in FIG. 3, the second gate structure 164, the contact region 160, the contact region 162 and the third doped layer 156 in FIG. 1 are omitted. The doped well 146 of the third doped region 136 is electrically connected with an electrode 378.

Figure 4:
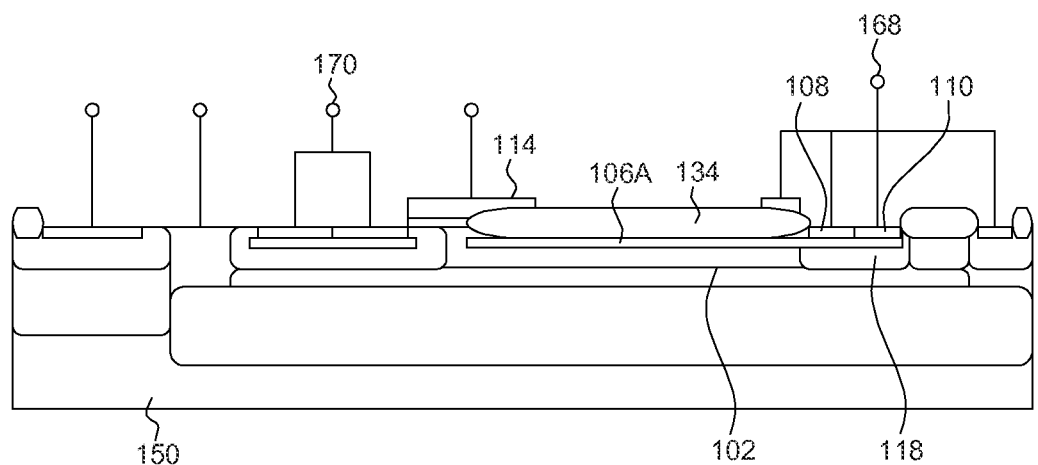
FIG. 4 illustrates a cross-section of a semiconductor device according to one embodiment.

FIG. 4, which illustrates a cross-section of a semiconductor device according to one embodiment, is different from FIG. 3 in following description. Referring to FIG. 4, the first doped layer 106A is adjoined with and under the first doped contact 108 and the second doped contact 110. In one embodiment, the second doped contact 110 has the first conductivity such as N-type conductivity, and the first doped contact 108 and the first doped layer 106A have the second conductivity such as P-type conductivity. In another embodiment, the first doped contact 108 has the first conductivity such as N-type conductivity, and the second doped contact 110 and the first doped layer 106A have the second conductivity such as P-type conductivity. During operating the IGBT device, an NPN bipolar structure formed by the first doped contact 108, the second doped contact 110, the first doped layer 106A and the doped well 118 of the first doped region 102 can help increasing the hole current and thus increasing an amplifying ratio of the electron current for the device. This NPN bipolar structure can prevent the IGVT device from undesired voltage snapback or negative differential resistance (NDR) effects. The (P-type conductivity) first doped layer 106 extended under the isolation layer 134 and adjacent to the first gate structure 114 can provide a flow channel closer to the electrode 170 for the hole current, and therefore the hole current can be prevented from going into the substrate 150 and affecting other devices.

Figure 5:
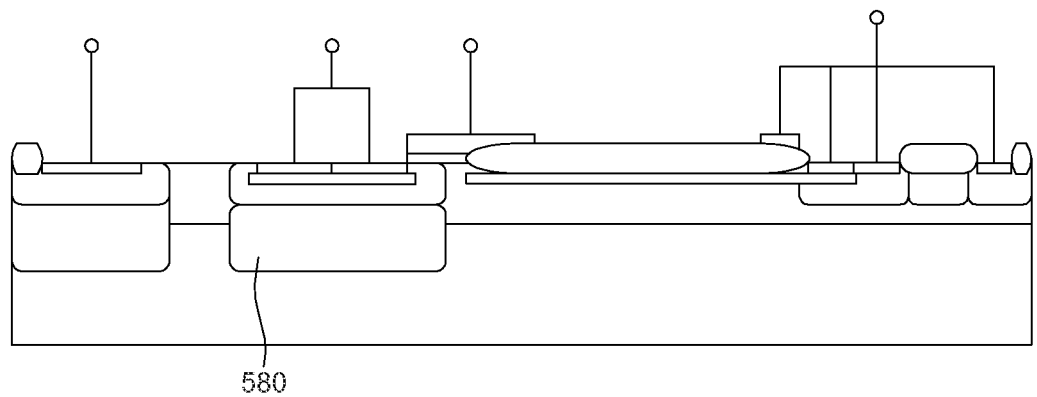
FIG. 5 illustrates a cross-section of a semiconductor device according to one embodiment.

FIG. 5, which illustrates a cross-section of a semiconductor device according to one embodiment, is different from FIG. 3 in following description. In the semiconductor device as shown in FIG. 5, the buried doped layer 144 having the first conductivity such as N-type conductivity in FIG. 3 is omitted. In addition, the buried doped layer 122 in FIG. 3 is replaced by a doped well 580 having the second conductivity such as P-type conductivity.

Figure 6:
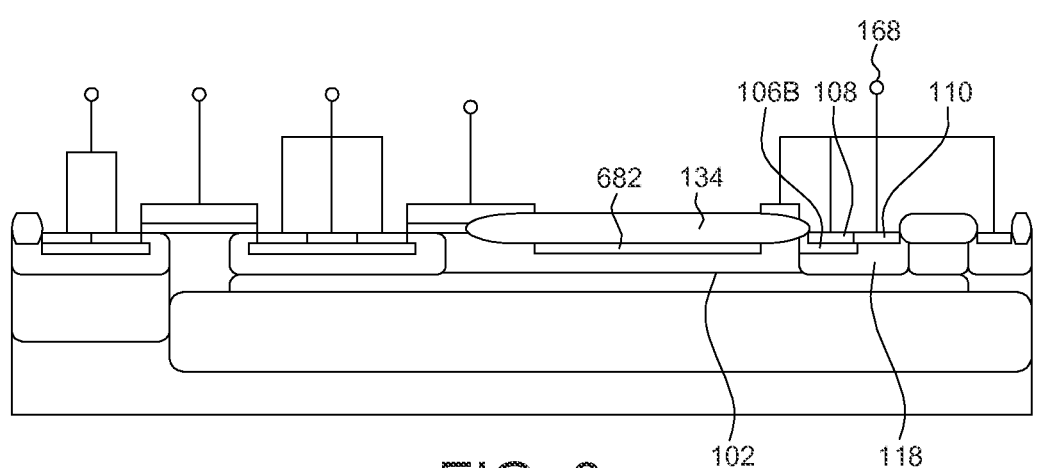
FIG. 6 illustrates a cross-section of a semiconductor device according to one embodiment.

FIG. 6, which illustrates a cross-section of a semiconductor device according to one embodiment, is different from FIG. 1 in following description. The first doped layer 106B is under the first doped contact 108, and on the doped well 118 of the first doped region 102. The first doped layer 106B is not extended to be under the isolation layer 134. In one embodiment, the first doped contact 108 has the first conductivity such as N-type conductivity, and the second doped contact 110 and the first doped layer 106B have the second conductivity such as P-type conductivity. An NPN bipolar structure formed by the first doped contact 108, the second doped contact 110, the first doped layer 106B and the doped well 118 of the first doped region 102 can help increasing the hole current and thus increasing an amplifying ratio of the electron current for the device. This NPN bipolar structure can prevent the IGVT device from undesired voltage snapback or negative differential resistance (NDR) effects. The first doped layer 106B is separated from a RESURF layer 682 having the second conductivity such as P-type conductivity and under the isolation layer 134.

Figure 7:
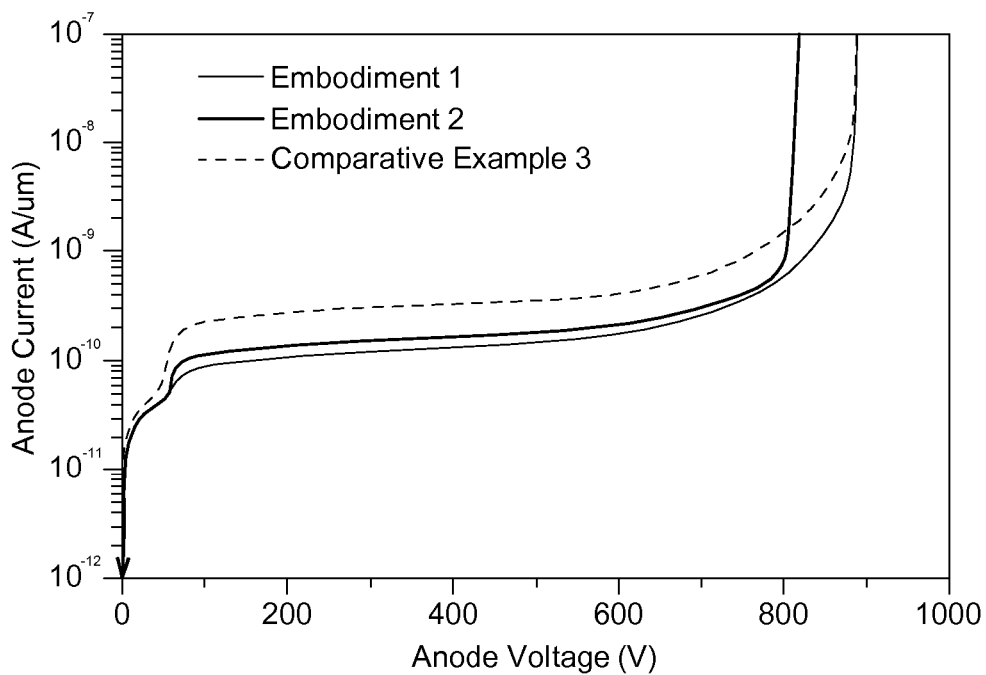
FIG. 7 and FIG. 8 show electrical curves of IBGT semiconductor devices.
Figure 8:
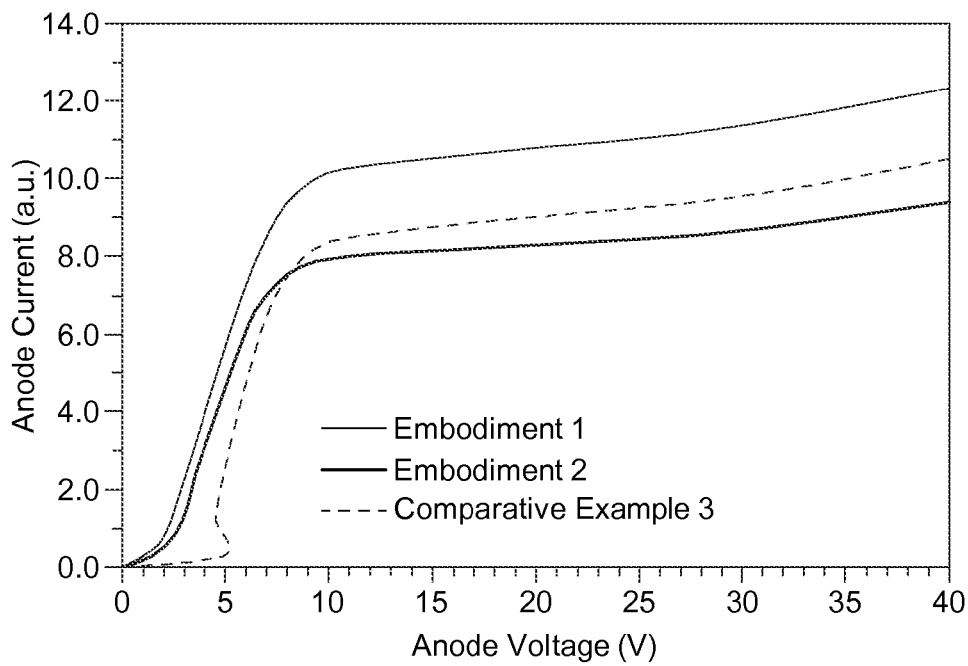
Figure 9:
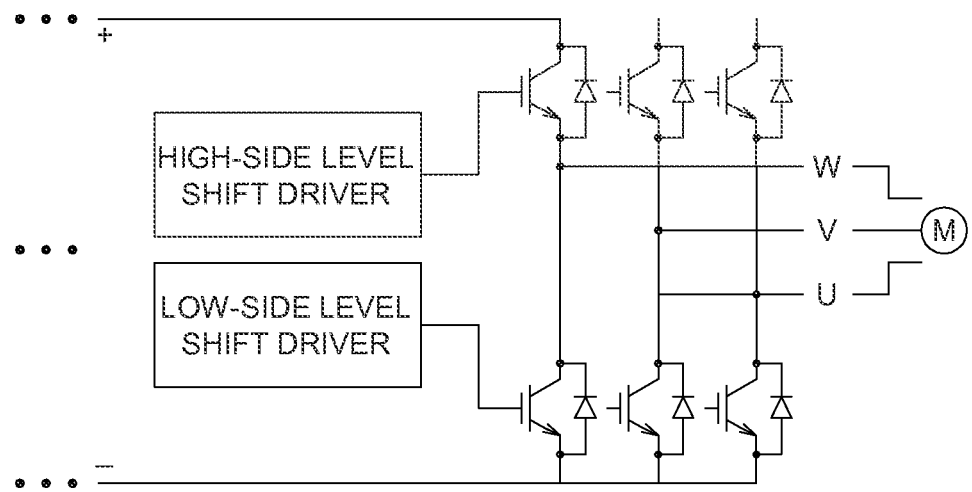
FIG. 9 illustrates a circuit using the semiconductor device in one embodiment.

FIG. 7 and FIG. 8 show electrical curves of IBGT semiconductor devices. The IBGT semiconductor device in embodiment 1 has the first doped layer that is extended to be under the isolation layer. The IBGT semiconductor device in embodiment 2 has the first doped layer that is not extended to be under the isolation layer. The IBGT semiconductor device in comparative example 3 has no first doped layer. From FIG. 7 and FIG. 8, it is found that the semiconductor devices in embodiments have advantages of saving power, increasing an output current, and avoiding voltage snapback effect occurring in comparative example. The IGBT semiconductor devices in embodiments can be applied to (for example, half bridge or full bridge) motor driver, as shown in FIG. 9.

In embodiments, for example, a gate electrode of the gate structure of the semiconductor device may comprise polysilicon, a metal, a metal silicide, or other suitable materials. The substrate may comprise a SOI. The semiconductor device may be formed by a local oxidation of silicon (SOI) process, a shallow trench isolation (STI) process, a deep trench isolation (DTI) process, a SOI process, an EPI process, a non-EPI process, or other suitable processes. The semiconductor device may be designed to have a structure having a hexagonal shape, an octagonal shape, a circle shape, a runway shape or other suitable shape.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
a first doped region having a first conductivity;
a second doped region adjoined with the first doped region and having a second conductivity opposite to the first conductivity;
a first doped contact;
a second doped contact having an opposing conductivity to the first doped contact, wherein the first doped contact and the second doped contact are on the first doped region, the first doped contact and the second doped contact have a first PN junction therebetween;
a first doped layer under the first doped contact or the second doped contact, wherein the first doped layer and the first or second doped contact have a second PN junction therebetween, and the second PN junction is adjoined with the first PN junction;
a third doped contact having the first conductivity and disposed in the second doped region; and
a first gate structure on the second doped region between the first doped region and the third doped contact.

2. The semiconductor device according to claim 1, wherein the first PN junction and the second PN junction adjoined with each other have L shape.

3. The semiconductor device according to claim 1, wherein the first doped layer is on the first doped region.

4. The semiconductor device according to claim 1, further comprising an isolation layer between the first doped contact and the third doped contact, wherein the first doped layer is between the isolation layer and the first doped region.

5. The semiconductor device according to claim 1, which is functioned as an IGBT device.

6. The semiconductor device according to claim 1, wherein the first doped contact is closer to the first gate structure than the second doped contact, the second doped contact has the first conductivity, the first doped contact and the first doped layer have the second conductivity, the first doped layer is adjoined with and under the first doped contact and the second doped contact.

7. The semiconductor device according to claim 1, wherein the first doped contact is closer to the first gate structure than the second doped contact, the first doped contact has the first conductivity, the second doped contact and the first doped layer have the second conductivity, the first doped layer is adjoined with and under the first doped contact.

8. The semiconductor device according to claim 1, wherein the first doped layer is adjoined with and under the first doped contact and the second doped contact.

9. The semiconductor device according to claim 1, wherein the first doped layer and the second doped region are separated from each other by the first doped region.

10. The semiconductor device according to claim 1, wherein the first doped contact and the second doped contact are electrically connected with one of an anode electrode and a cathode electrode, the third doped contact is electrically connected with the other of the anode electrode and the cathode electrode.

11. The semiconductor device according to claim 1, wherein the first doped region is surrounded by the second doped region.

12. The semiconductor device according to claim 1, further comprising a third doped region having the first conductivity, wherein the second doped region is surrounded by the third doped region.

13. The semiconductor device according to claim 12, wherein the first doped contact, the second doped contact, the first doped layer and the first doped region form a NPN structure.

14. The semiconductor device according to claim 12, further comprising:
   a contact region having the first conductivity, wherein the second doped region is between the third doped region and the contact region; and
   a second gate structure on a portion of the third doped region adjacent to the contact region.

15. The semiconductor device according to claim 1, further comprising:
   a third doped region having the first conductivity and adjacent to the second doped region;
   a fourth doped region having the second conductivity;
   a contact region having the first conductivity and in the fourth doped region; and
   a second gate structure on the fourth doped region between the third doped region and the contact region.

16. A method for operating a semiconductor device, wherein the semiconductor device comprises:
   a first doped region having a first conductivity;
   a second doped region adjoined with the first doped region and having a second conductivity opposite to the first conductivity;
   a first doped contact;
   a second doped contact having an opposing conductivity to the first doped contact, wherein the first doped contact and the second doped contact are on the first doped region, the first doped contact and the second doped contact have a first PN junction therebetween;
   a first doped layer under the first doped contact or the second doped contact, wherein the first doped layer and the first or second doped contact have a second PN junction therebetween, and the second PN junction is adjoined with the first PN junction;
   a third doped contact having the first conductivity and in the second doped region; and
   a first gate structure on the second doped region between the first doped region and the third doped contact,
   the operating method comprises:
   applying a first voltage to the first gate structure;
   electrically connecting the first doped contact and the second doped contact to a first electrode being one of an anode electrode and a cathode electrode; and
   electrically connecting the third doped contact to a second electrode being the other of the anode electrode and the cathode electrode.

17. The method for operating the semiconductor device according to claim 16, wherein the semiconductor device further comprises a third doped region having the first conductivity and surrounding the second doped region.

18. The method for operating the semiconductor device according to claim 17, wherein the semiconductor device further comprises:
   a contact region having the first conductivity, wherein the second doped region is between the third doped region and the contact region; and
   a second gate structure on a portion of the third doped region adjacent to the contact region,
   the operating method further comprises:
   applying a second voltage to the second gate structure;
   electrically connecting the third doped region to the first electrode;
   electrically connecting the contact region to the second electrode.

19. The method for operating the semiconductor device according to claim 16, wherein the semiconductor device further comprises:
   a third doped region having the first conductivity and adjacent to the second doped region;
   a fourth doped region having the second conductivity;
   a contact region having the first conductivity and in the fourth doped region; and
   a second gate structure on the fourth doped region between the third doped region and the contact region,
   the operating method further comprises:
   applying a second voltage to the second gate structure;
   electrically connect the third doped region with the first electrode; and
   electrically connecting the contact region and the fourth doped region with a third electrode.

20. The method for operating the semiconductor device according to claim 16, wherein the first electrode is the anode electrode, the second electrode is the cathode electrode.

* * * * *